United States Patent [19]

Shima et al.

[11] Patent Number: 5,009,863
[45] Date of Patent: Apr. 23, 1991

[54] APPARATUS FOR MANUFACTURING SILICON SINGLE CRYSTALS

[75] Inventors: Yoshinobu Shima, Yokohama; Hiroshi Kamio, Tokyo, both of Japan

[73] Assignee: NKK Corporation, Tokyo, Japan

[21] Appl. No.: 540,647

[22] Filed: Jun. 19, 1990

Related U.S. Application Data

[63] Continuation-in-part of Ser. No. 433,596, Nov. 8, 1989.

[30] Foreign Application Priority Data

Nov. 11, 1988 [JP] Japan .................. 63-284017

[51] Int. Cl.$^5$ .................. C30B 35/00; C30B 15/12
[52] U.S. Cl. .................. 422/249; 156/617.1; 156/DIG. 83; 156/DIG. 115
[58] Field of Search .................. 422/245, 248, 249; 156/605, 617.1, DIG. 83, 115; 501/33

[56] References Cited

U.S. PATENT DOCUMENTS

| | | | |
|---|---|---|---|
| 2,892,739 | 6/1959 | Rusler | 156/620.3 |
| 4,010,064 | 3/1977 | Patrick et al. | 156/DIG. 83 |
| 4,015,048 | 3/1977 | Martin | 501/70 |
| 4,042,361 | 8/1977 | Bihuniak et al. | 65/18 |
| 4,200,445 | 4/1980 | Bihoniak et al. | 423/332 |
| 4,238,274 | 12/1980 | Chu et al. | 156/617 |
| 4,528,163 | 7/1985 | Albecht | 156/DIG. 83 |
| 4,911,896 | 3/1990 | Bihuniak et al. | 156/DIG. 83 |

FOREIGN PATENT DOCUMENTS

| | | | |
|---|---|---|---|
| 962868 | 4/1987 | Fed. Rep. of Germany | 422/248 |
| 2625513 | 7/1989 | France . | |
| 177988 | 5/1988 | Japan . | |

OTHER PUBLICATIONS

Lin et al., Ann. Rev. Mater. Sci. 17, 273-298 (1987), Palo Alto, CA.

*Primary Examiner*—Gary P. Straub
*Assistant Examiner*—Stephen G. Kalinchak
*Attorney, Agent, or Firm*—Michael N. Meller

[57] ABSTRACT

A silicon single crystal manufacturing apparatus in which a partition member formed with at least one small hole through its lower part is arranged in a rotating quartz crucible so as to surround a large cylindrical silicon single crystal which is rotated and pulled. The whole or part of the partition member is made from cellular silica glass whose cell content (volume percentage) is between 0.01 and 15% or less than 0.01% but increased to 0.01 through 15% by the heat used for melting starting silicon material. Thus, the molten material contacting with the inside of the partition member is prevented from decreasing in temperature and solidification of the molten material from this portion is prevented.

4 Claims, 6 Drawing Sheets

FIG. I

F I G. 5a
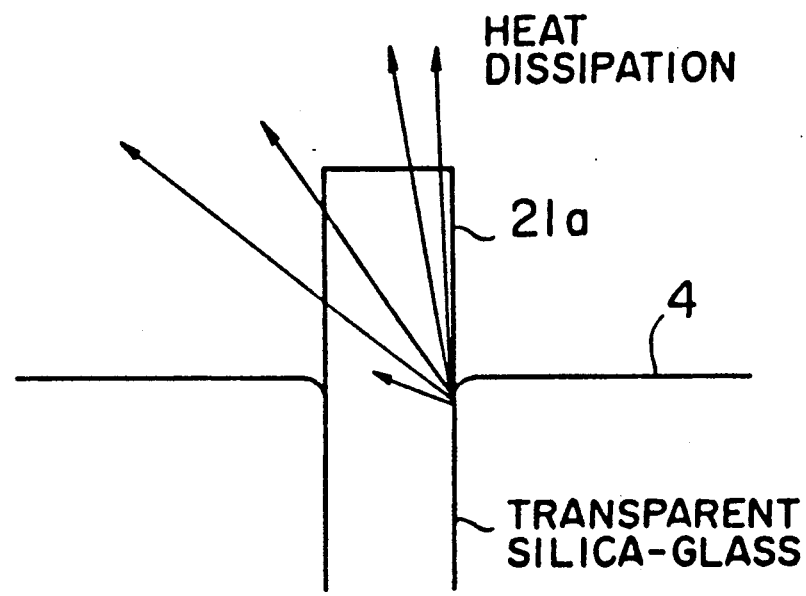
F I G. 5b
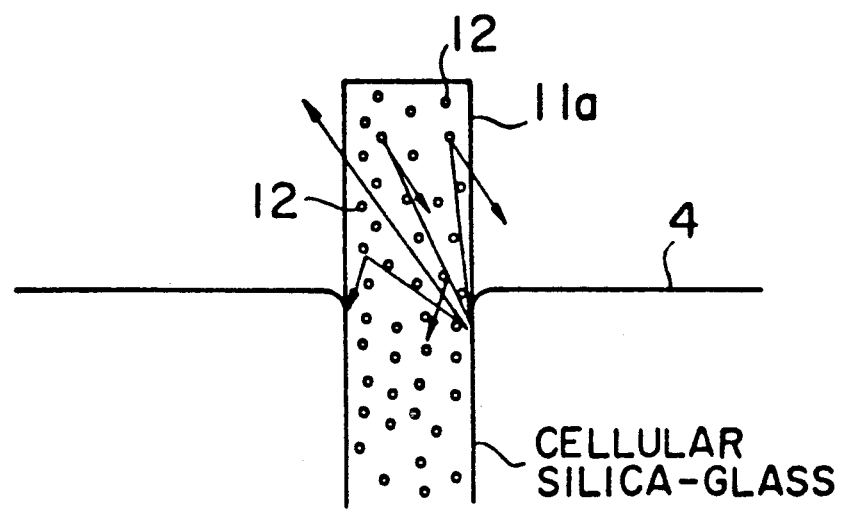

APPARATUS FOR MANUFACTURING SILICON SINGLE CRYSTALS

This is a continuation-in-part of U.S. Ser. No. 433,596 filed Nov. 8, 1989, now abandoned.

BACKGROUND OF THE INVENTION

1. Field of the Invention

The present invention relates to an apparatus for manufacturing silicon single crystals by the Czochralski method.

2. Description of the Prior Art

The silicon single crystal pulling process according to the Czochralski method has been used in the past and it has become a practically complete technique. However, where the specification is severe, the yield of usable wafers will be reduced to less than 50% due to the maldistribution of the dopant and oxygen.

As an effective means of solving such a problem, the prior art shows a method in which a silicon starting material is continuously fed into a crucible having a double structure, thereby maintaining the surface level of the molten material constant (Laid-Open Patent No. 40-10184). In particular, the manufacture of high quality granular polycrystal silicon has recently become possible and it has been considered relatively easy to feed this granular silicon to the molten material continuously at a constant feed rate, thus leading to the publication, of some inventions and a paper (inventions of Laid-Open Patents No. 58-130195 and No. 63-95195 and Laid-Open Utility Model No. 59-141578 and the paper Ann. Rev. Mater, Sci, 1987, Vol. 17, P273-278).

The inventions disclosed in these publications, etc., are of the type employing a silica glass crucible of the double structure. However, as particularly pointed out in the publication of Laid-Open Patent No. 62-241889, there is the problem of the solidification of the melt which tends to occur at the contacting portion between the inner surface of the inner crucible and the molten silicon surface, thus making it difficult to decrease the furnace temperature to the temperature required for the stable growth of a single crystal. If the pulling of a single crystal is effected by keeping the temperature of the molten silicon high so as to prevent the occurrence of solidification, not only is the rate of solidification decreased but also the occurrence of dislocation frequently takes place, thus making it impossible to stably manufacture a single crystal. Also the invention disclosed in Laid-Open Patent No. 61-36197 employs a crucible of the double structure as well as a heat insulating material arranged above the outer material melting section and a separate heater arranged at the bottom of the crucible so as to promote the melting of the starting material supplied. However, this invention also involves no means for preventing the dissipation of heat from the contacting portion between the inner surface of the inner crucible and the molten silicon surface so as to prevent the occurrence of solidification. In addition, the heating by the heater at the bottom of the crucible decreases the temperature of another heater arranged along the side of the crucible thus promoting the occurrence of solidification.

In the manufacturing method of the above-mentioned type using the partition of the inner crucible (hereinafter referred to as a partition), particularly, the method of manufacturing large-diameter silicon single crystals of 12 to 30 cm, the heat dissipation from inside the partition tends to decrease the temperature of the molten material inside the partition, particularly the molten material contacting with the partition. This is considered to be caused by the fact that the material of the partition is transparent silica glass having an emissivity considerably greater than that of the molten silicon and a great amount of heat is dissipated from the partition to the water-cooled cover above the crucible. Also, due to the crucible being of the double structure, the convection of the molten silicon is limited and the temperature inside the partition has a lesser tendency to rise.

Moreover, while the temperature of the molten silicon inside the partition (crystal growing section) must be maintained just above the melting point of silicon in order to ensure the growth of a single crystal, due to the previously mentioned phenomena, there is caused the problem of the solidification starting at the contacting portion between the partition and the surface of the molten material inside the partition.

However, the previously mentioned conventional techniques have not been provided with any means for preventing the occurrence of such solidification.

SUMMARY OF THE INVENTION

The present invention has been made to overcome the foregoing deficiencies in the prior art, and it is an object of the present invention to provide an apparatus for manufacturing silicon single crystals, more particularly, large cylindrical silicon single crystals of 12 to 30 cm in diameter, in which a starting material, in granular or lumpy form, is continuously fed into a crucible containing the molten material and which is capable of preventing the occurrence of solidification at the contacting portion between a partition immersed in the crucible and the surface of the molten material inside the partition.

The present invention has been made to solve the problems and accomplish the above object and thus there is provided an improved silicon single crystal manufacturing apparatus in which a rotating crucible containing molten silicon material is divided by a partition member formed with at least one small hole therethrough in such a manner that the partition member surrounds a large cylindrical silicon single crystal of 12 to 30 cm in diameter, which is pulled while being rotated, and the molten material is moved smoothly through the hole, and the silicon single crystal is grown from inside the partition member while continuously feeding the silicon material to the outer side of the partition member. The apparatus has the following essential features:

The whole or part of the partition member is made from cellular silica glass or alternatively the portion of the partition member which contacts with the molten silicon material is made from cellular silica glass and the remaining portion is made from transparent silica glass.

The cellular silica glass portion of the partition member is formed of cellular silica glass having a cell content (volume percentage) of not less than 0.01% and not greater than 15%. Alternatively, the cellular silica glass portion of the partition member is formed of cellular silica glass having a cell content (volume percentage) of less than 0.01% and the cell content (volume percentage) is increased to not less than 0.01% and not greater than 15% by the heat for melting the silicon material preliminarily charged into the crucible.

BRIEF DESCRIPTION OF THE DRAWINGS

FIGS. 5a and 5b are diagrams for comparing the operations of the transparent silica glass and the cellular silica glass.

IN THE DRAWINGS

Numeral 1 designates a crucible, 2 a graphite crucible, 3 a pedestal, 4 molten material, 5 a silicon single crystal, 6 a heater, 7 a heat insulating material, 8 a chamber, 11 a partition member, 12 cells, 13 a small hole, 14 a starting material feeder, 15 and 16 temperature detectors, 17 a heat insulating cover, 18 feed material, 22 starting material melting section, 23 crystal growing section.

DESCRIPTION OF THE PREFERRED EMBODIMENTS

The construction of the partition member forming the principal part of the present invention will be described first. Referring to FIG. 5, there are illustrated schematic diagrams showing, respectively, the conditions in which transparent silica glass 21a and cellular silica glass 11a are immersed in molten material. In the case of the transparent silica glass 21a shown in FIG. 5a, it will be seen that the contacting portion between the molten material 4 and the glass 21a is transparent and, therefore, the amount of heat dissipated from the molten material surface through the glass is increased. In addition, the heat dissipation of the transparent silica glass 21a is so large that the portion of the molten material 4 contacting with the glass 21a is decreased in temperature and the solidification tends to occur at this portion.

Contrary, in the case of the cellular silica glass 11a, the presence of cells 12 in the glass has the effect of scattering the dissipation of heat from the contacting portion between the molten material 4 and the cellular silica glass 11a and thus the heat dissipated from the molten material surface through the glass 11a is decreased as compared with the transparent silica glass 21a. Also, the cooling due to the heat transmission is reduced by the presence of the cells. As a result, in the portion of the molten material 4 contacting with the cellular silica glass 11a is not practically decreased in temperature and thus the molten material 4 prevented from solidifying. These effects are basically produced due to the reduced light transmittance. As a result, not only the cell content but also the surface roughness and the peak density can be controlled to reduce the transparency and is expected to prevent the occurrence of solidification. Also, since the dissipation of heat from the molten material 4 through the glass is reduced as the secondary effect of the cellular silica glass 11a, there is the effect of decreasing the temperature variations and wettability variations in the portion of the molten material 4 contacting with the cellular silica glass 11a.

Figure 1:
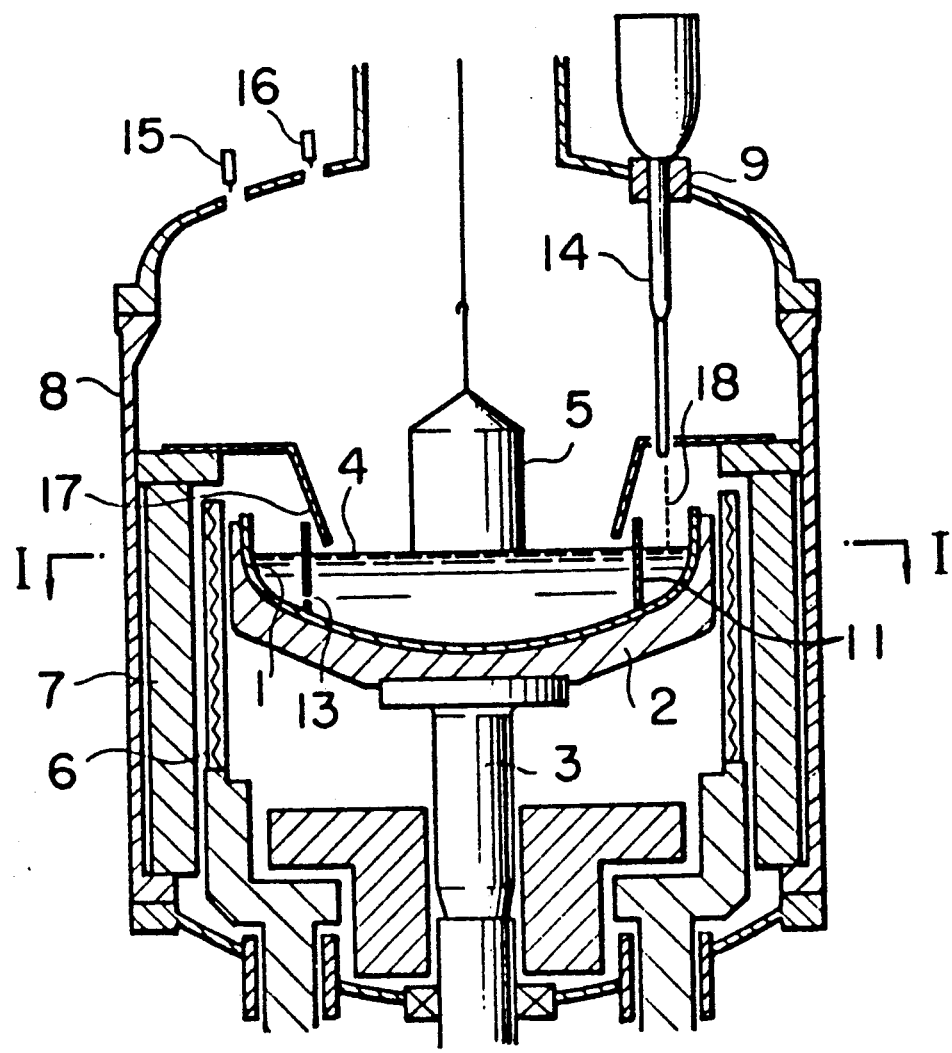
FIG. 1 is a longitudinal sectional view showing schematically an embodiment of the present invention.
Figure 2:
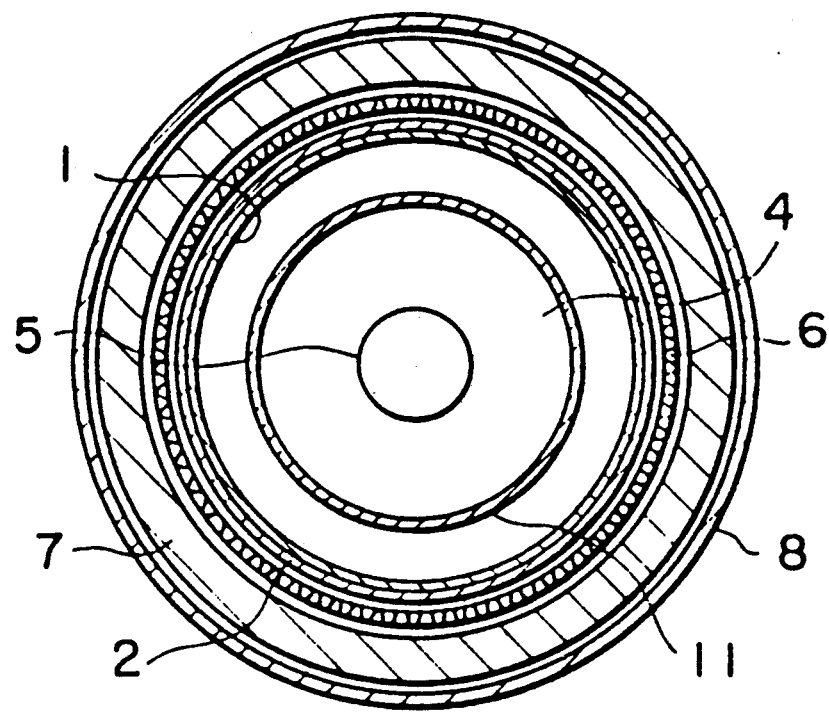
FIG. 2 is a sectional view taken along the line I—I of FIG. 1.

FIG. 1 is a sectional view showing schematically an embodiment of the present invention and FIG. 2 is a sectional view taken along the line I—I of FIG. 1. In the Figures, numeral 1 designates a silica crucible set in a graphite crucible 2, and the graphite crucible 2 is vertically movably and rotatably supported on a pedestal 3. Numeral 4 designates molten silicon material contained in the crucible 1, and a silicon single crystal 5 grown into a large cylindrical form of 12 to 30 cm in diameter is pulled from the molten silicon material 4. Numeral 6 designates a heater surrounding the graphite crucible 2, and 7 a hot-zone heat insulating material surrounding the heater 6. These component parts are basically the same as the component parts of the ordinary single crystal pulling apparatus according to the Czochralski method.

Figure 3:
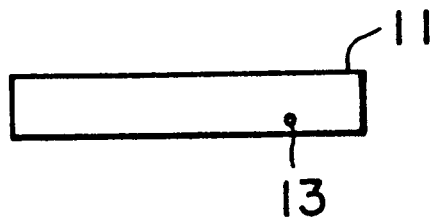
FIG. 3 is a side view showing an embodiment of the partition member.

Number 11 designates a partition member made from a cellular high-purity silica glass and arranged concentrically with the crucible 1, and at least one small hole 13 is formed through its region below substantially the central portion in the height direction as shown by way of example in FIG. 3. When a starting material is charged, the partition member 11 is set, along with the starting material, in the crucible 1 so that after the starting material has been melted, the partition member is immersed in the molten material 4 so as to surround the single crystal 5 and its upper portion is exposed from the molten material surface. Also, its lower edge portion is practically fused to the crucible 1 and therefore it is prevented from floating. As a result, the molten material 4 outside the partition member 11 is moved to the inner side thereof only through the small hole 13. It is to be noted that the partition member 11 may be preliminarily fused to the crucible 1.

Numeral 9 designates an opening formed in a chamber 8 in correspondence to the molten material surface outside the partition member 11, and fixedly inserted into the opening 9 is a feeder 14 for feeding a starting material in granular or lumpy form. The forward end of the feeder 14 is in opposition to the molten material surface outside the partition member 11. The feeder 14 is connected to a starting material feed chamber (not shown) arranged outside the chamber 8 thereby continuously feeding the granular or lumpy starting material.

Numerals 15 and 16 designate temperature detectors such as radiation thermometers arranged in the upper part of the chamber 8 so that the temperature detector 15 measures the temperature of the molten material surface outside the partition member 11 and the other temperature detector 16 measures the temperature of the molten material inside thereof.

Numeral 17 designates a heat insulating cover which in this embodiment is provided to enhance further the heat insulating effect on the partition member 11 although the cellular silica glass partition member 11 itself has a function of preventing the occurrence of solidification.

In accordance with the present invention, due to the fact that the partition member 11 is made from cellular silica glass, the heat dissipation from the contacting portion between the inner surface of the partition member 11 and the molten silicon material 4 is decreased to prevent solidification of the molten material at the partition member 11. This solidification preventing effect on the molten material 4 by the cellular silica glass is caused usually with a cell content (volume percentage) of 0.01% or over. In the case of cellular silica glass having a cell content (volume percentage) of less than 0.01%, however, the solidification preventing effect on molten material can be similarly obtained if new cells are formed by the heat for melting the silicon material or if the cell content (volume percentage) is increased to greater than 0.01%, due to the expansion of the already existing cells.

On the other hand, in the case of cellular silica glass with a cell content of greater than 15%, the probability of impeding the growing of a single crystal due to the stripping off of the glass is extremely increased.

In view of these results, the growing of a silicon single crystal is effected by using cellular silica glass having a cell content (volume percentage) of preferably between 0.01 and 15%.

Figure 4A:
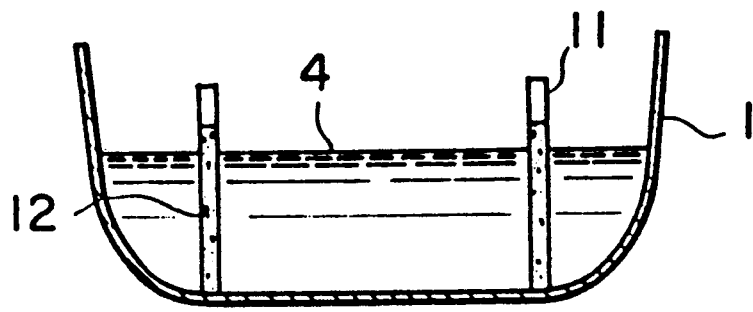
FIGS. 4a and 4b are schematic diagrams showing other embodiments of the partition member.
Figure 4B:
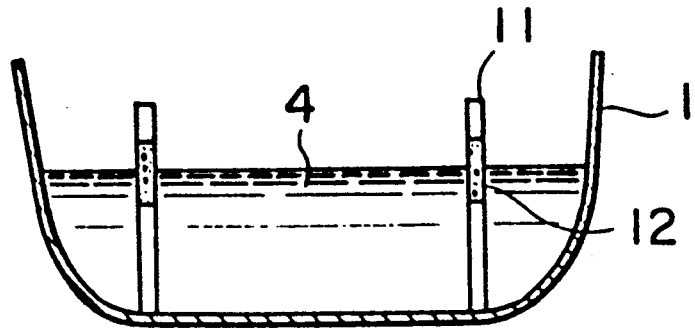

The molten material solidification preventing effect of the partition member 11 due to the above-mentioned cellular silica glass can be ensured if only the cellular silica glass is positioned at the contacting portion between the molten material 4 and the partition member 11. For example, the partition member 11 of the type composed of cellular silica glass extending from the bottom to about 1 cm above the molten material surface as shown in the embodiment of FIG. 4a and another type in which only the portion extending above the below the molten material surface by about 1 cm is composed of cellular silica glass and the remaining portion is composed of transparent silica glass as shown in FIG. 4b also have the solidification preventing effect.

As will be seen from the foregoing description, according to a silicon single crystal manufacturing apparatus of the present invention in which a rotating crucible containing molten silicon material is divided by a partition member formed with at least one small hole therethrough in such a manner that the partition member surrounds a large cylindrical silicon crystal of 12 to 30 cm in diameter which is pulled while being rotated and the molten silicon material is movable smoothly and the silicon single crystal is grown inside the partition member while feeding starting silicon material continuously to the outer side of the partition member, the whole or part of the partition member is made from cellular silica glass so that the dissipation of heat from the molten material near the partition member is reduced and the molten material is prevented from being solidified from its portion contacting with the partition member, thereby pulling the sound silicon single crystal. Thus, the working of the present invention has great effects that the yield is improved due to the uniform quality in the pulling direction of a silicon single crystal, that the improved productivity is attained.

As described above, the use of the cellular silica glass reduces the temperature variation and wettability variation of the meniscus portion where the molten silicon and the partition member make contact with each other. As a result, the occurrence of ripples on the molten silicon surface is reduced by a mechanism which will be described later. This smoothening of the molten silicon surface has a very great effect on improving the quality of the crystal (the reduction of OSF (oxidation induced staking fault)). The reason is that the crystal growth is considerably stabilized. That which has a direct effect on the OSF is the occurrence of ripples on the surface of the molten silicon in the single crystal growing section. However, the occurrence of large ripples in the starting material melting section is not desirable since these ripples are propagated to the single crystal growing section through the communication hole formed through the partition member. The foregoing improvement of the crystal quality constitutes a second feature of the present invention.

A method which ensures the maximum possible display of this second effect is specified as follows: The cell content of the partition member is selected to be from 0.01% to 15% and 1/1.3 or less of the cell content of the quartz crucible whereby the light transmittance of the partition member is in a range from 5/1000 to 40/100 times the light transmittance of non-cellular silica glass and it is also over 2 times the light transmittance of the quartz crucible. If the previously mentioned temperature variation and wettability variation of the meniscus portion exists, ripples are caused on the molten silicon surface by the following mechanism.

Figure 6A:
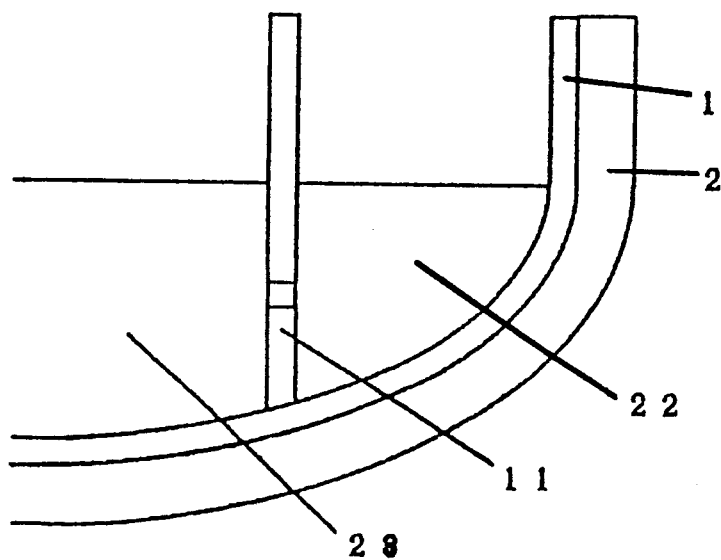
FIGS. 6a through 6c illustrate schematic diagrams for explaining the principle of the occurrence of ripples on the surface of molten silicon.

The molten silicon is a liquid having a relatively large surface tension. It is known that generally the surface tension is a function of temperature and the surface tension is decreased with an increase in the temperature. FIG. 6(a) illustrates a schematic diagram of the contacting portion between the molten silicon and the silica glass partition member 11. The molten silicon in a starting material melting section 22 is high in temperature and it serves the role of supplying heat to the molten silicon in a single crystal growing section 23. Here, note that the meniscus portion where the molten silicon in the single temperature of the molten silicon in the single crystal growing section 23 and the partition member 11 contact with each other. When the temperature of the molten silicon is low, the surface tension is increased so that the meniscus has the shape $R_1$ shown in FIG. 6(b). With this shape, the heat dissipation $Q_2$ from the molten silicon surface near the partition member 11 is reduced and the molten silicon surface tends to receive the heat $Q_1$ from the starting material melting section 22. Thus, immediately after the meniscus has taken this shape, the temperature of the molten silicon surface in the meniscus portion is increased. As a result, the surface tension is reduced and the meniscus portion rises along the partition member 11. Then, it takes the shape $R_2$ shown in FIG. 6(c). When this shape results, the heat dissipation $Q_4$ at this time is so large that the temperature of the molten silicon surface in the meniscus portion is decreased. Then, it again returns to the shape $R_1$ shown in FIG. 6(b). In other words, the meniscus portion repeats its up and down movements (vibrations). This repetition is considered to be the cause of occurrence of ripples on the molten silicon surface.

Figure 6B:
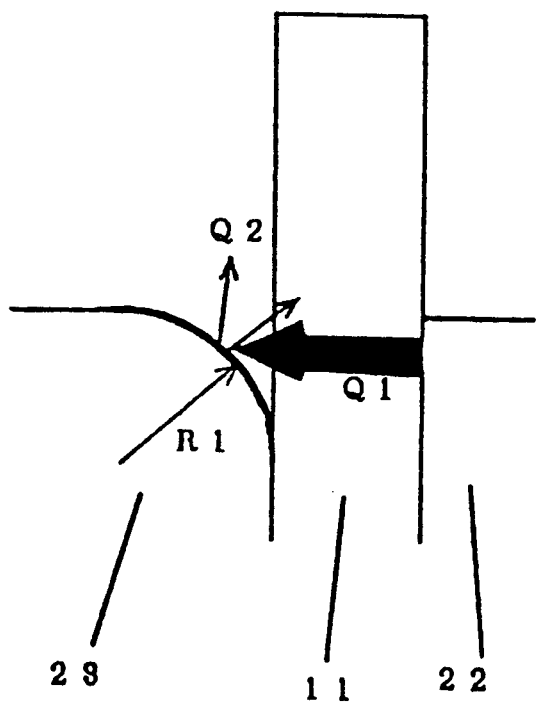
Figure 6C:
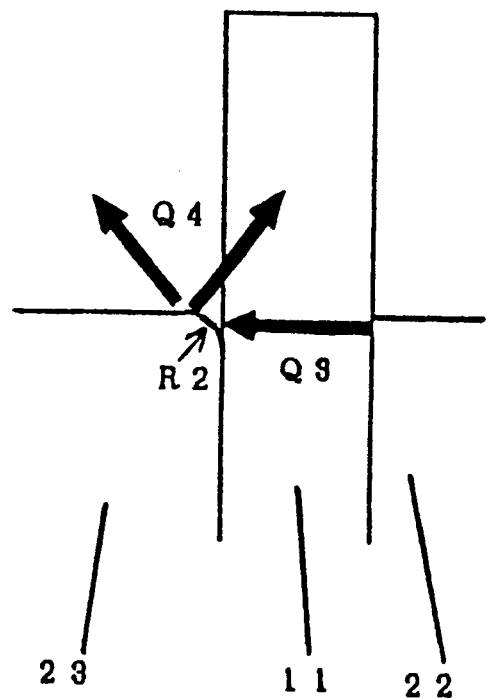

This can be prevented by simply reducing the heat input $Q_1$ from the starting material melting section 22 to the single crystal growing section 23 in the condition of FIG. 6(b). In other words, it is only necessary to decrease the heat radiation transmittance of the partition. By so doing, the amount of change from the condition of FIG. 6(b) to the condition of FIG. 6(c) (the amount of rise of the meniscus) is decreased and the ripples on the molten silicon surface are reduced. At the molten silicon temperature (1450° C.) the heat radiation includes a large amount of visible light components and, therefore, the heat radiation transmittance may be replaced with the maximum value of a transmittance for the light of wavelengths ranging from 400 nm to 1500 nm. Here, the light transmittance is the ratio of transmitted light intensity to incident light intensity when the light transmission rate of non-cellular silica glass is taken as 1. In order to reduce the ripples on the molten silicon surface to fall within the range of practical use, it is necessary to reduce the light transmittance of the partition to 40/100 or less. The lower limit is 5/1000. If the light transmittance is less than 5/1000, the surface irregularities and the internal cells are increased excessively and the danger of the broken pieces of silica entering the molten silicon becomes extremely great.

The light transmittance is decreased with an increase in the content of the cells in the silica glass. This is due to the scattering of light by the cells. If the cell content (volume percentage) is selected 0.01 or over, the light transmittance is reduced to 40/100 or less.

The upper limit of the cell content (volume percentage) is 15%. The reason is that if the cell content exceeds 15%, the pieces of the broken glass come off and thus the probability of the silicon single crystal being polycrystallized becomes extremely high. As a second method, the surface of the silica glass may be formed with irregularities. The light transmittance is decreased with increase in the peak density of the irregularities. The light transmittance can also be varied by varying the degree of the surface roughness. In other words, the transmittance can be adjusted by adjusting the peak density and the roughness. The practical peak line density ppi (peak/inch) is in a range between 10 and 25000 and range of roughness is from 1 $\mu$m to 2000 $\mu$m in terms of r.m.s.

In addition, the first and second methods may be combined for the purpose of decreasing the light transmittance.

The second problem is the ripples on the molten silicon surface in the starting material melting section. The cause is the same as in the case of the partition member. Since the ripples are caused in the contacting portion between the quartz crucible and the molten silicon, the source of input heat to the molten silicon is the graphite crucible of a higher temperature. The second problem differs in this respect from the case of the partition. The molten silicon temperature of the starting material melting section is apparently higher than the molten silicon temperature in the single crystal growing section and the occurrence of larger ripples than in the case of the partition member is observed.

The countermeasure is also to decrease the light transmittance of the silica glass forming the crucible.

Figure 7:
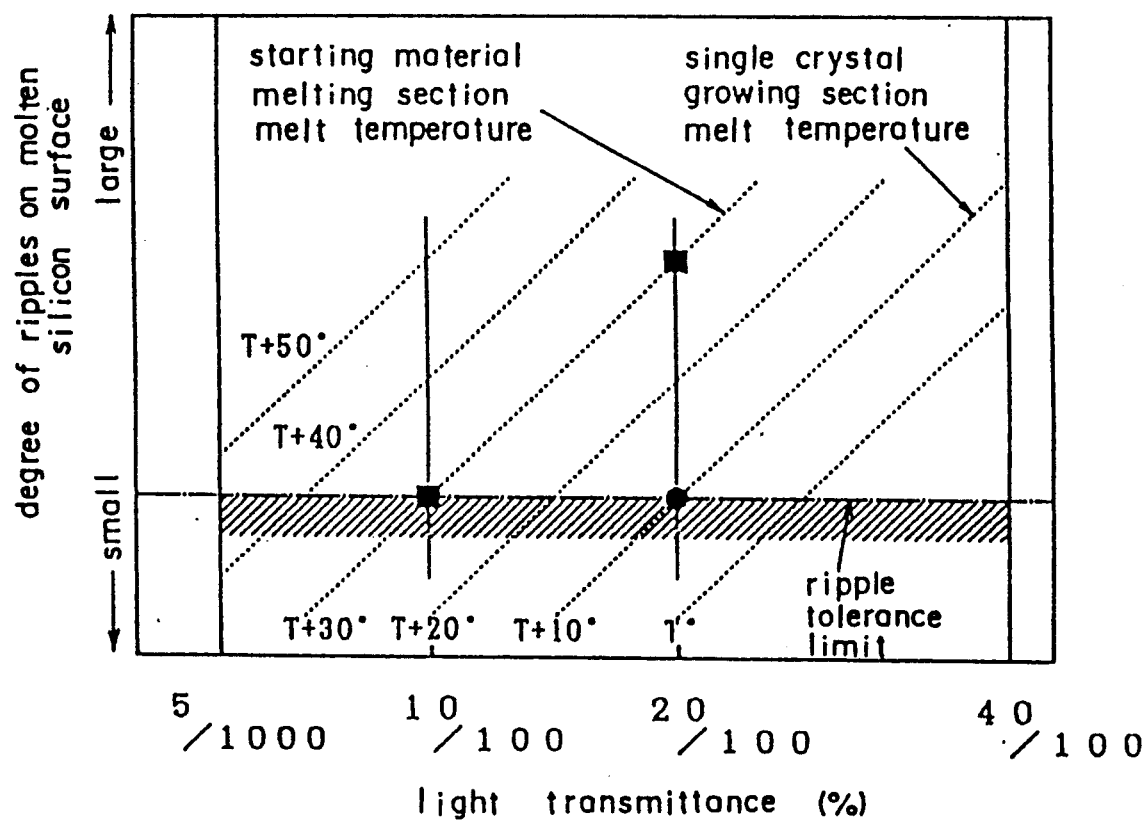
FIG. 7 is a graph showing schematically the relation between the degree of ripples and the light transmittance of silica glass with the temperature of the molten silicon near the silica glass as a parameter.

FIG. 7 shows schematically the relation between the degree of ripples and the light transmittance of the silica glass. The temperature of the molten silicon near the silica glass is used as a parameter. In the Figure, the broken lines represent the isotherms. Where the molten silicon temperature is constant, the ripples become smaller with decrease in the light transmittance. Also, where the light transmittances are the same, it is indicated that the ripples are larger when the molten silicon temperature is higher.

Assume now that the molten silicon temperature near the partition on the single crystal growing section side is T+10°C. In this case, in order to reduce the ripples on the molten silicon surface, the light transmittance must be 20/100 or less. Since the reduced transmittance means the rough surface or the increased cells, there is the greater danger of the broken silica pieces entering the molten silicon. As a result, the upper limit of the tolerance limits should preferably be selected for the light transmittance. Namely, the light transmittance of 20/100 is the best in this case.

While the molten silicon temperature of the starting material melting section is higher than the molten silicon temperature of the single crystal growing section as mentioned previously, it is assumed that the molten silicon temperature of the starting material melting section is higher than that of the single crystal growing section by 20° C. At this time, if the light transmittance of the quartz crystal is 20/100 which is the same with that of the partition member, larger ripples are caused near the quartz crucible in the starting material melting section. In order to prevent this, the light transmittance of the quartz crucible must be lower than the light transmittance of the partition member. In fact, the reduced ripple condition can also be produced in the starting material melting section if the light transmittance of the quartz crucible is less than ½ of that of the partition member or less than 10/100 in this case.

The same methods as used for reducing the light transmittance of the partition member can be used as the methods for reducing the light transmittance of the quartz crucible.

Where the cell content is increased to reduce the light transmittance, the cell content of the quartz crucible can be increased to over 1.3 times the cell content (volume percentage) of the partition member so as to reduce the light transmittance of the quartz crucible to ½ or less of that of the partition member.

When the silica glass surface is formed with irregularities to reduce the light transmittance, the peak density of the irregularities can be increased as compared with that of the partition member, thereby reducing the light transmittance of the quartz crucible to ½ or less of that of the partition member. The range of practical peak line densities ppi (peak/inch) is from 10 to 25000 as in the case of the partition member and the range of degrees of roughness is from 1 $\mu$m to 2000 $\mu$m in terms of r.m.s.

Crystals were grown by the apparatus of FIG. 1 and the relation between the materials of the partition member and the crucible and the OSF density was examined. The principal growing conditions other than the materials of the partition member and the crucible were as follows:

Crystal diameter, 6 inches; crucible diameter, 20 inches; crucible revolutions, 10 r.p.m.; crystal revolutions, 20 r.p.m.; heat keeping cover thickness, tantalum sheet of 0.2 mm.

The examination results are shown in Table 1 below. In the case of the conditions 1 and 2, the cell contents and the surface conditions were adjusted such that the light transmittances of the silica glass partition members were from 5/1000 to 40/100 and also over 2 times the light transmittances of the quartz crucibles, thereby attaining the OSF density of 10 pieces/cm². The growing conditions 3 and 4 deviated from these conditions thus showing higher OSF densities.

Also, it is needless to say that in the growing conditions 1 and 2 the light transmittances were also proper, thus preventing the occurrence of solidification at the partition members.

Here, the rate of light transmittance of the non-cellular glass was used the value of 80/100 on the supposition that the value in vacuum was 1.

TABLE 1

| | Partition | | | | Crucible | | | | OSF density (/cm$^2$) |
|---|---|---|---|---|---|---|---|---|---|
| | Cell[%] | r.m.s. ($\mu$m) | ppi | Transmittance | Cell[%] | r.m.s. ($\mu$m) | ppi | Transmittance | |
| Growing Conditions 1 | 0.3 | 5 | 120 | 20/100 | 4 | 200 | 100 | 7/1000 | 10 pieces or less |
| Growing Conditions 2 | 0 | 100 | 100 | 4/100 | 6 | 100 | 100 | 1/1000 | " |
| Growing Conditions 3 | 1 | 5 | 120 | 3/100 | 0.5 | 5 | 120 | 5/100 | 30–70 |
| Growing Conditions 4 | 0 | 0.5 | 120 | 50/100 | 1 | 10 | 100 | 13/1000 | 150–200 |

What is claimed is:

1. In a silicon single crystal manufacturing apparatus comprising a rotation-type cellular quartz crucible containing molten silicon, an electric resistance heater for heating said quartz crucible from the side thereof, a quartz partition member arranged to divide said molten silicon into a single crystal growing section and a starting material melting section within said quartz crucible, said partition member being formed with at least one hole for passing molten silicon therethrough, a heat keeping cover arranged to cover an inner side of said partition member and above said starting material melting section, and starting material feeding means for continuously feeding starting material silicon to said starting material melting section whereby manufacturing silicon single crystals of not less than 12 cm and not greater than 30 cm in diameter, the improvement wherein said partition member is made from cellular silica glass having a cell content, in volume percent, ranging from 0.01% to 15%, and wherein the cell content of the quartz crucible is over 1.3 times greater than the cell content of the partition member, whereby the radiant heat dissipation through said partition member is reduced to a range from 5/1000 to 40/100 times the radiant heat dissipation of non-cellular silica glass.

2. An apparatus according to claim 1, wherein the light transmittance of said silica glass partition member is in a range from 5/1000 to 40/100 times the light transmittance of non-cellular silica glass, and wherein the light transmittance of said partition member is over 2 times the light transmittance of said quartz crucible.

3. An apparatus according to claim 2, wherein said partition member and said quartz crucible are adjusted in surface roughness and peak density thereof whereby the light transmittance of said partition member is in a range from 5/1000 to 40/100 times the light transmittance of non-cellular silica glass, and the light transmittance of said partition member is over 2 times the light transmittance of said quartz crucible.

4. An apparatus according to claim 2, wherein said partition member and said quartz crucible are adjusted in cell content in volume percent, surface roughness and peak density thereof such that the light transmittance of said partition member is in a range from 5/1000 to 40/100 times the light transmittance of non-cellular silica glass and that the light transmittance of said partition member is over 2 times the light transmittance of said quartz crucible.

* * * * *